United States Patent [19]

Matsubara et al.

[11] Patent Number: 4,860,087
[45] Date of Patent: Aug. 22, 1989

[54] SEMICONDUCTOR DEVICE AND PROCESS FOR PRODUCING THE SAME

[75] Inventors: Kiyoshi Matsubara, Kodaira; Tadashi Yamaura, Kokubunji; Toshimasa Kihara, Tachikawa; Norishige Kawashimo, Tokorozawa, all of Japan

[73] Assignee: Hitachi, Ltd., Tokyo, Japan

[21] Appl. No.: 284,841

[22] Filed: Dec. 13, 1988

Related U.S. Application Data

[63] Continuation of Ser. No. 35,009, Mar. 26, 1987, abandoned.

[30] Foreign Application Priority Data

Mar. 26, 1986 [JP] Japan ................................. 61-65677

[51] Int. Cl.⁴ ............................................. H01L 23/48
[52] U.S. Cl. ............................................ 357/68; 357/70
[58] Field of Search ................................. 357/68, 70

[56] References Cited

U.S. PATENT DOCUMENTS

| | | | |
|---|---|---|---|
| 3,591,839 | 7/1971 | Evans | 357/68 |
| 4,124,864 | 11/1978 | Greenberg | 357/70 |
| 4,143,385 | 3/1979 | Miyoshi et al. | 357/68 |
| 4,736,236 | 4/1988 | Butt | 357/68 |
| 4,800,418 | 1/1989 | Natsui | 357/68 |

FOREIGN PATENT DOCUMENTS

| | | | |
|---|---|---|---|
| 53-39891 | 4/1978 | Japan | 357/70 |
| 53-70766 | 6/1978 | Japan | 357/70 |
| 55-52250 | 4/1980 | Japan | 357/70 |
| 56-51851 | 5/1981 | Japan | 357/70 |
| 57-20440 | 2/1982 | Japan | 357/70 |
| 59-121960 | 7/1984 | Japan | 357/70 |
| 59-229850 | 12/1984 | Japan | 357/70 |
| 59-231826 | 12/1984 | Japan | 357/70 |
| 61-32436 | 2/1986 | Japan | 357/70 |

Primary Examiner—Rolf Hille
Assistant Examiner—Hoanganh Le
Attorney, Agent, or Firm—Antonelli, Terry & Wands

[57] ABSTRACT

The present invention relates to a semiconductor device and a process for producing the same. The principal surface of a semiconductor pellet is provided with a plurality of first bonding pad electrodes arranged in a first arrangement state and a plurality of second bonding pad electrodes which are provided with substantially the same electric circuit functions as those of the corresponding first bonding pad electrodes and which are arranged in a second arrangement state that is different from the first arrangement state. By virtue of the above-described means, it is possible to connect together pad electrodes and mating external terminals of a mounting substrate in the same way regardless of whether the pellet is mounted according to the face-up or face-down method. Accordingly, it is unnecessary to prepare different kinds of pellet having individual pad arrangements which conform with respective mounting methods, and it is possible to cope with a multiplicity of different kinds of mounting method with one kind of pellet.

6 Claims, 7 Drawing Sheets

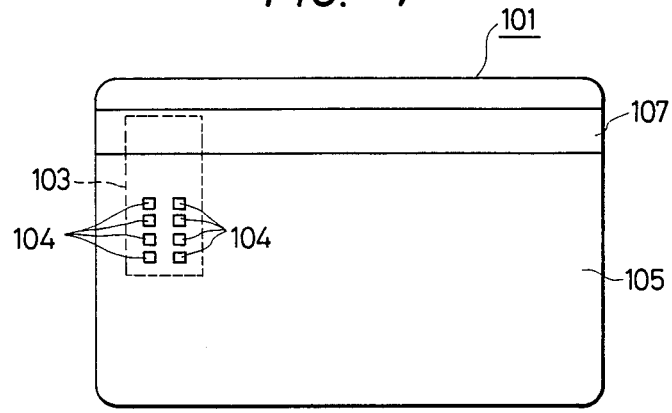
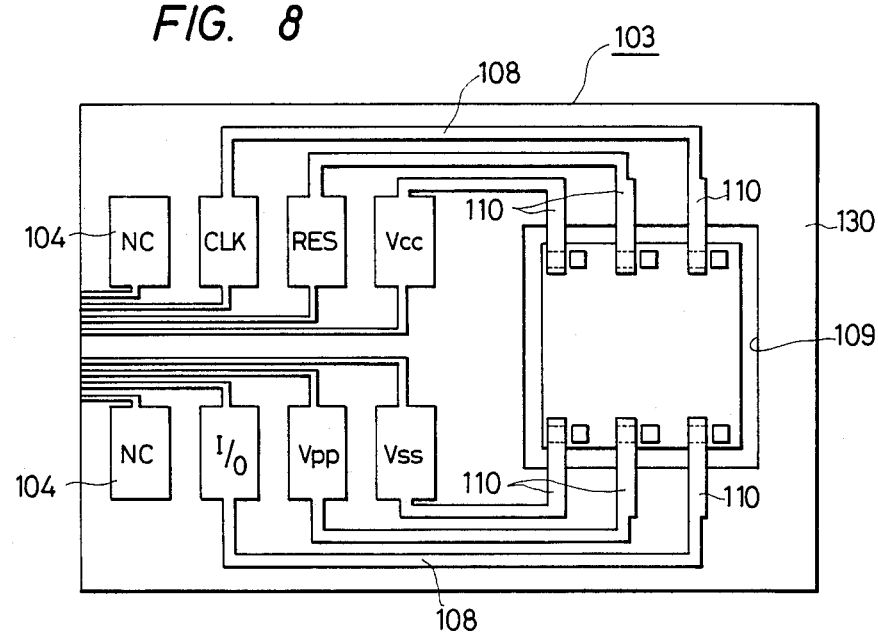

SEMICONDUCTOR DEVICE AND PROCESS FOR PRODUCING THE SAME

This is a continuation of application Ser. No. 035,009, filed Mar. 26, 1987, abandoned.

BACKGROUND OF THE INVENTION

The present invention relates to a semiconductor device and a process for producing the same. More particularly, the present invention pertains to a technique which may effectively be applied to, for example, a semiconductor pellet incorporated in an IC card and a method of mounting the same.

The semiconductor pellet mounting technique by the TAB (Tape Automated Bonding) method (i.e., tape carrier method) is described in "IC Packaging Technique" (edited by Japan Microelectronics Association) published by Kabushiki Kaisha Kogyo Chosakai, Jan. 15, 1980. pp. 143 to 144. This literature explains methods of mounting semiconductor pellets (hereinafter referred to simply as "pellets"), supplied by the TAB method and each having an integrated circuit fabricated thereon, in face-up and face-down manners, respectively by way of drawings.

The present inventor examined techniques for mounting semiconductor pellets each having an integrated circuit fabricated thereon.

More specifically, pellets are generally mounted on wiring substrates having external connecting terminals according to either one of the following two methods, that is, the so-called face-down method wherein a pellet is disposed in such a manner that the surface thereof on which are formed bonding pad electrodes faces the surface of a wiring substrate, the bonding pad electrodes being provided for connection with external wiring terminals formed on the surface of the wiring substrate, or the so-called face-up method wherein a pellet is disposed in such a manner that its reverse surface faces the surface of a wiring substrate.

SUMMARY OF THE INVENTION

In the case of, for example, IC cards, the arrangement of terminals on substrates on which pellets are to be mounted is specified according to ISO (International Organization for Standardization); in such a case, the terminal arrangement on the substrate side cannot be changed. Accordingly, it is necessary, in order to mount pellets on such substrates, to prepare two different kinds of pellets which differ from each other in terms of the arrangement of bonding pad electrodes in accordance with the difference between the above-described mounting methods even in the case of pellets having the same electric circuit configuration. More specifically, there is a need to prepare two different kinds of pellets which have different bonding pad arrangements, that is, pellets which are designed for the face-down mounting method and pellets for the face-up mounting method.

In view of the above-described circumstances, it is a primary object of the present invention to provide a semiconductor device which is capable of coping with a multiplicity of different kinds of mounting methods without the need to change the external terminal arrangement on the wiring substrate side, together with a technique for producing said semiconductor device.

The above and other objects and novel features and advantages of the present invention will become clear from the following description of the preferred embodiments thereof, taken in conjunction with the accompanying drawings.

A representative one of the novel techniques disclosed in this application will briefly be described below.

The principal surface of a semiconductor pellet having an integrated circuit fabricated thereon is provided with a plurality of first bonding pad electrodes arranged in a first arrangement state and a plurality of second bonding pad electrodes which are provided with substantially the same electric circuit functions as those of the corresponding first bonding pad electrodes and which are arranged in a second arrangement state that is different from the first arrangement state.

By virtue of the above-described means, it is possible to connect together pad electrodes and mating external terminals of a mounting substrate in the same way regardless of whether the pellet is mounted according to the face-up or face-down method. Accordingly, it is unnecessary to prepare different kinds of pellets having individual pad arrangements which conform with respective mounting methods, and it is possible to cope with a multiplicity of different kinds of mounting methods with one kind of pellet.

BRIEF DESCRIPTION OF THE DRAWINGS

FIG. 7 is a plan view of an IC card in accordance with another embodiment of the present invention;

FIG. 8 is a plan view of a tape carrier type module incorporated in the IC card illustrated in FIG. 7;

DESCRIPTION OF THE PREFERRED EMBODIMENTS

Embodiment 1

Figure 4:
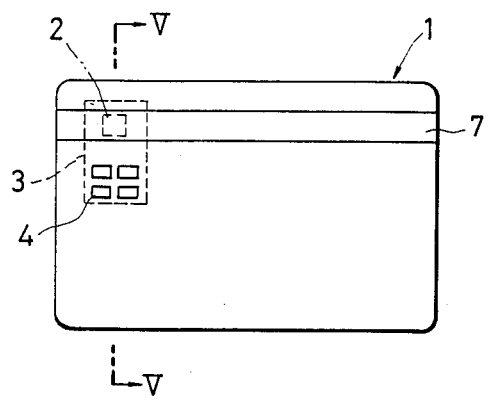
FIG. 4 is a plan view of the general arrangement of an IC card according to the embodiment.

The semiconductor device according to this embodiment constitutes a so-called IC card 1 and has a rectangular planar shape with its four corners cut so as to be rounded as shown in FIG. 4. A semiconductor pellet 2 is mounted on an electrode module 3 such as that shown in FIG. 6 and incorporated in the IC card 1 in this state. External electrodes 4 which are electrically connected to the pellet 2 are exposed and slightly projected from the surface of the IC card 1.

Figure 5:
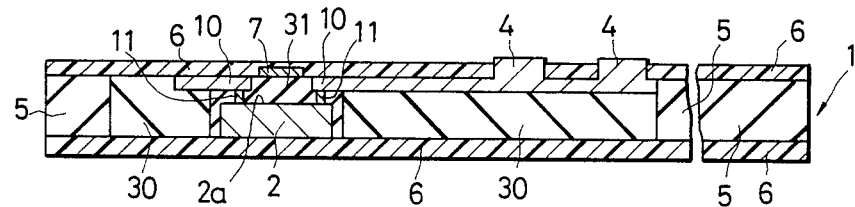
FIG. 5 is an enlarged sectional view taken along the line V—V of FIG. 4.

The cross-sectional structure of the IC card 1 is shown in FIG. 5. More specifically, the electrode module 3 provided with the pellet 2 is mounted on a card substrate 5 made of a rigid polyvinyl chloride, and oversheet films 6 of a rigid polyvinyl chloride are respectively laminated on both the obverse and reverse surfaces of the card substrate 5. It should be noted that a magnetic stripe 7 is buried immediately above the pellet 2 by means of laminating, although this is not particularly limitative.

Figure 6:
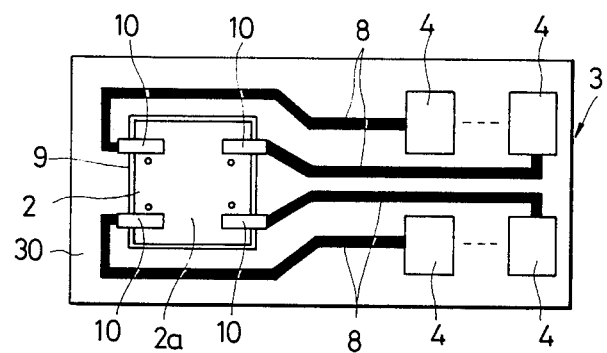
FIG. 6 is an enlarged plan view of an electrode module.

The electrode module 3 is arranged as shown in FIGS. 5 and 6. More specifically, printed wirings made of, for example, copper foil, or metallized layers 8 are bonded to the surface of an insulating sheet 30 made of, for example, glass epoxy resin, and external electrodes 4 are provided at respective outer ends of the metallized layers 8. The insulating sheet 30 is provided with a pellet mounting bore 9, and the other ends of the metallized layers 8 are integrally connected to predetermined leads 10, respectively, which are provided so as to extend to the upper side of the pellet mounting bore 9.

Figure 2:
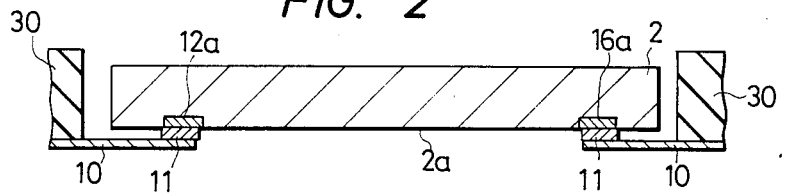
FIG. 2 is an enlarged sectional view schematically illustrating one example of mounting of a pellet according to the face-down method.

The pellet 2 is, as shown in FIG. 5 and also in FIG. 2 which shows only an essential part thereof in an enlarged view, mounted according to the so-called face-down method wherein its surface 2a on which is formed a semiconductor integrated circuit faces the leads 10 of the electrode module 3. More specifically, the pellet 2 is provided on its surface with bump electrodes (bonding pad electrodes) 11 made of solder or the like, the bump electrodes being connected to the respective leads 10 using the wireless bonding technique, that is, the TAB (Tape Automated Bonding) technique. The surface of the pellet 2 is covered with an undercoating material or a surface protecting material 31 defined by an epoxy resin which is coated after the bonding of the leads 10.

Figure 1:
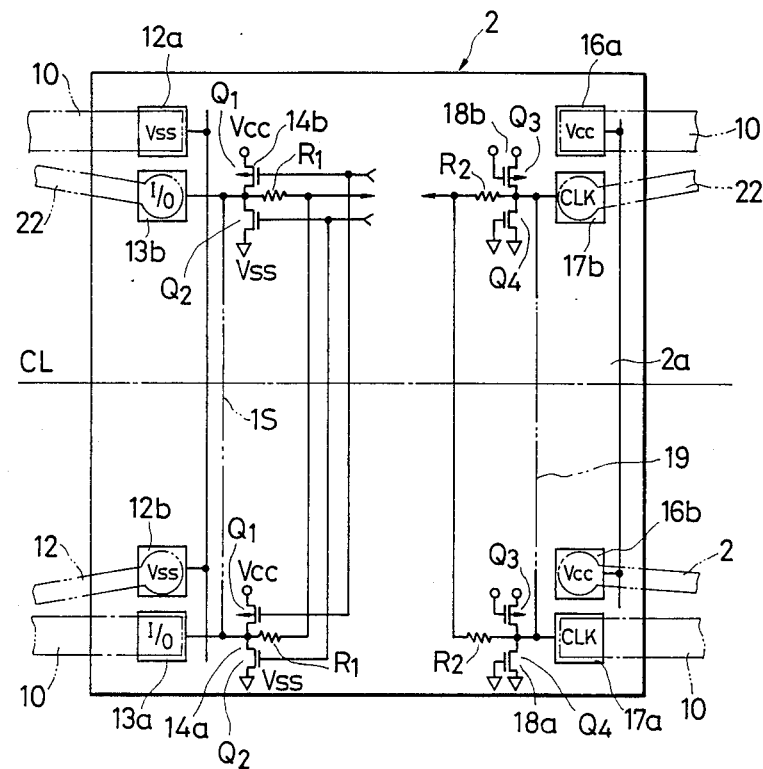
FIG. 1 is an enlarged plan view schematically illustrating the arrangement of bonding pad electrodes formed on a pellet employed in one embodiment of the present invention.

The pellet 2 in accordance with this embodiment has a variety of bonding pad electrodes arranged on its surface, that is, the semiconductor integrated circuit forming surface 2a, as shown in FIG. 1. In this embodiment, these bonding pad electrodes are arranged in a predetermined regular pattern such as a substantially mirror-symmetric pattern. More specifically, the bonding pad electrodes are disposed in such a manner that a plurality of required pads of the same kind are connected together so that, when the pellet 2 is turned upside down by rotating the surface 2a of the pellet 2 through 180 degree about the central line CL thereof, the pads are disposed near positions corresponding to predetermined pad positions before the turning of the pellet 2 and the electrode module 3 therefore faces pads having the same functions as the pads which the module 3 faced before the turning of the pellet 2 at any positions thereon. Thus, the pads are arranged so that the external terminals of the module 3 are respectively connected to pads respectively having the same functions regardless of whether the pellet 2 is mounted in the face-up or face-down manner.

More specifically, as viewed in FIG. 1, a ground pad (Vss) 12a is provided in the left upper portion of the pellet 2, and an input/output pad (I/O) 13b is provided below the ground pad 12a, while a ground pad (Vss) 12b and an input/output pad (I/O) 13a which have the same functions as those of the above-described pads, respectively, are provided in the left bottom portion of the pellet 2 in parallel movement relation to the first-described pads. The ground pads 12a and 12b are electrically connected together, and the input/output pads 13b and 13a are also electrically connected together. In the embodiment shown in FIG. 1. An output buffer circuit for the input/output pads (I/O) 13b and 13a is arranged to provide these pads with the same function but is defined by output buffer circuits 14b and 14a which are provided in one-to-one correspondence to the pads 13b and 13a, respectively. The output buffer circuit 14b is constituted by a P-channel output MOSFET $Q_1$ and an N-channel output MOSFET $Q_2$ which are disposed near the pad 13b so that the distance between the output node thereof and the pad 13b is minimized. Similarly, the output buffer 14a is constituted by two MOSFETs which are disposed near the pad 13a. This arrangement enables a load connected through the pad 13b or 13a and the corresponding external electrode 4 to be driven in an excellent state.

It should be noted that, since the pads 13b and 13a are provided with the same function, it is possible to omit either one of the two output buffer circuits 14b and 14a, for example, the circuit 14a, and connect the output terminal of the output buffer circuit 14b to the pad 13a through a new wiring layer 15 which extends over the pellet (chip) 2. However, when the present invention is carried out in such an alternative form, attention must be paid to the following points. Namely, a floating capacitance which is constituted by the wiring layer 15 imposes an undesirable capacitive load on the output buffer circuit 14b. Further, a power supply wiring Vcc and a ground or reference potential wiring Vss are formed in such a manner as to extend over the pellet (chip) 2 so as to enable supply of electric power to various circuits provided on the pellet (chip) 2, which results in the wiring layer 15 needing to cross these wirings. In such a case, the power supply wiring and the reference potential wiring preferably have a minimized impedance with a view to preventing a malfunction or the like of the circuits. Therefore, in the case where the cross wiring structure is constituted by, for example, a semiconductor wiring layer and a wiring layer of a metal such as aluminum which is disposed so as to cross the semiconductor wiring layer, at the cross structure portion the power supply wiring and the reference potential wiring are constituted by metal wiring layers having a relatively small resistance, while a wiring layer such as the wiring layer 15 is defined by a semiconductor wiring layer. Accordingly, the wiring layer 15 has a relatively high resistance or impedance; in such a case, it becomes difficult to apply a signal which changes satisfactorily to the pad 13a to which the wiring layer 15 is connected.

It should be noted that each of the resistors $R_1$ provided in the arrangement shown in FIG. 1 is a protecting resistor for an input circuit which is supplied with a signal through the pad 13b or 13a. The resistor $R_1$ constitutes a circuit which substantially functions as a surge absorbing circuit, together with a capacitance such as an input capacitance constituted by an input circuit (not shown) formed on the pellet 2. Therefore, the input circuit is protected from any surge voltage which may undesirably be applied to the pad 13b or 13a by means, for example, of frictional electricity through the corresponding external electrode 4 shown in FIGS. 4 to 6.

A power supply pad (Vcc) 16a and a clock pad (CLK) 17b are provided in the right upper portion of the pellet 2 as viewed in FIG. 1, while a power supply pad (Vcc) 16b and a clock pad (CLK) 17a are provided in the right bottom of the pellet 2 in correspondence with the power supply pad (Vcc) 16a and the clock pad (CLK) 17b. The power supply pads 16a, 16b and the clock pads 17a, 17b are electrically connected together, respectively. It should be noted that, in the arrangement shown in FIG. 1, the clock pads (CLK) 17b and 17a are respectively provided with protecting circuits 18b and 18a each consisting of a P-channel MOSFET $Q_3$, an N-channel MOSFET $Q_4$ and a resistor $R_2$ which are formed on the pellet 2.

The MOSFET $Q_3$ is connected at its gate and source to the power supply wiring Vcc, while the MOSFET $Q_4$ is connected at its gate and source to the reference potential wiring Vss, thereby limiting the surge voltage level by means of the breakdown voltage thereof. The protecting circuit 18b or 18a protects an input circuit (not shown) formed on the pellet 2 from any surge voltage applied to the clock pad 17b or 17a, the input circuit being supplied with a clock pulse signal through the pad 17b or 17a.

It should be noted that it is possible to directly connect the pads 17b and 17a through a newly provided wiring layer 19 and omit either one of the two protecing circuits 18b and 18a, for example, the circuit 18a. However, when the present invention is carried out in such an alternative form, attention must be paid to the following points. Namely, the wiring layer 19, which is formed so as to extend over the pellet 2, has an inductance and a resistance which cannot be ignored. A voltage which is changed extremely suddenly, such as a surge voltage, is not substantially limited by such inductance. Accordingly, if a surge voltage is applied to a pad such as the pad 17a, a portion of the wiring layer 19 which is close to the pad 17a is raised to a level which is substantially equal to the surge voltage. When a surge voltage is undesirably applied to the wiring layer 19 formed on the pellet 2, there is a fear of the surge voltage being applied to internal wirings and circuit elements formed on the pellet 2 through an undesirable coupling capacitance. Accordingly, there is a risk of the circuit elements and the like being deteriorated in their characteristics or destroyed.

In this embodiment, among the above-described pad electrodes, only the ground pad (Vss) 12a, the input-/output pad (I/O) 13a, the power supply pad (Vcc) 16a and the clock pad (CLK) 17a are connected to the respective leads 10, and the other pads are not connected to any leads 10.

The pellet 2 may also be mounted on an electrode module 3a using s bonding material 20 such as silver paste in a state wherein the opposite surface with respect to the integrated circuit forming surface 2a faces the surface of the module 3a, that is, according to the face-up mounting method. In such mounting method, the bonding pad electrodes of the pellet 2 are electrically connected to respective electrode terminals 21 of the module 3a by, for example, wire bonding, as follows.

When the pellet 2 which is in the face-down state shown in FIG. 2 is turned through 180 degrees so that the semiconductor integrated circuit forming surface 2a faces up, the pads which are bonded to respective leads 10 arranged in a predetermined pattern when the pellet 2 is mounted in the face-down mounting manner cannot match the electrode terminal arrangement on the module 3a. Accordingly, there is a fear of pellets for face-down mounting being impossible to use for face-up mounting.

In this embodiment, however, pads for wire bonding are formed on the pellet 2 so that, when the pellet 2 is turned upside down by rotating the surface 2a of the pellet 2 through 180 degree about the central line CL shown in FIG. 1, the pads are disposed near positions corresponding to wireless bonding pad positions before the turning of the pellet 2 and the electrode module 3a therefore faces pads respectively having the same functions as the pads which the module 3a faced before the turning of the pellet 2 at any positions thereon. Accordingly, the pads and the corresponding electrode terminals 21 can be electrically connected together by means of wire bonding using bonding wires 22 such as fine gold, aluminum or copper wires without the need to change the arrangement of terminals formed on the electrode module 3a serving as a wiring substrate, or the arrangement of pads formed on the pellet 2. Any of the wire bonding techniques, that is, ball bonding, thermo compression bonding, thermo compression bonding using ultrasonic vibration, and ultrasonic bonding, enables satisfactory wire bonding even if the wire bonding pad electrodes on the pellet 2 and their corresponding external terminal leads are arranged in various positional relationships to each other.

Figure 3:
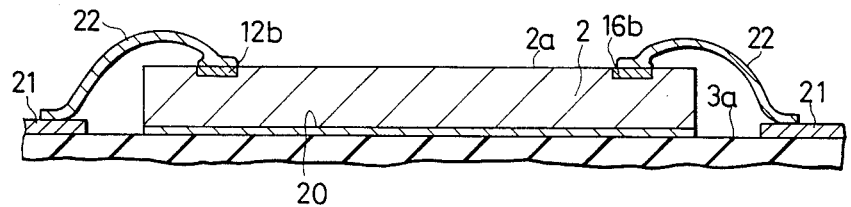
FIG. 3 is an enlarged sectional view schematically illustrating one example of mounting of a pellet according to the face-up method.

More specifically, to mount the pellet 2 in the face-up manner as shown in FIG. 3, it is only necessary to connect wires 22 to the ground pad (Vss) 12b, the input-/output pad (I/O) 13b, the power supply pad (Vcc) 16b and the clock pad (CLK) 17b, respectively. Thus, it is possible to realize face-up or face-down mounting with a single kind of pellet without the need to change the arrangement of terminals formed on the electrode module 3 or 3a serving as a wiring substrate, simply by selecting pads to which corresponding leads 10 or wires 22 are to be connected according to a particular mounting method employed.

As has been described above, it is possible, according to this embodiment, to obtain the following advantageous effects.

(1) Bonding pad electrodes are formed so that, when the pellet 2 is turned upside down by rotating the surface 2a of the pellet 2 through 180 degree about the central line CL shown in FIG. 1, the pads are respectively disposed near positions corresponding to predetermined pad positions before the turning of the pellet 2 and the electrode module 3 therefore faces pads having the same functions as the pads which the module 3a faced before the turning of the pellet 2 at any positions thereon, whereby external terminals can be respectively connected to pads respectively having the same functions regardless of whether the pellet 2 is mounted in the face-up or face-down manner. Accordingly, it is possible to realize either face-down or face-up mounting with a single kind of pellet 2 without the need to change the arrangement of terminals formed on the electrode module 3a or the arrangement of pads on the pellet 2.

(2) By virtue of the advantage (1), it is possible, with a single kind of pellet 2, to increase the degree of freedom with which packaging is effected, and this enables diversification of the package structure.

Although the invention accomplished by the present inventor has practically been described by way of one embodiment, the present invention is not necessarily limited to the described embodiment and various changes and modifications may, of course, be imparted thereto without departing from the scope and spirit of the invention. For example, although in the abovedescribed embodiment the central line CL about which the pellet 2 is turned through 180 degrees is drawn horizontally as viewed in FIG. 1, pads may also be disposed about a central line which is drawn along the center of the pellet 3 vertically as viewed in FIG. 1.

Further, although wire bonding alone has been described as one example of bonding employed in the face-up mounting, leads may be bonded to their corresponding pads through respective bump electrodes in the same way as in the case of the face-down mounting.

Furthermore, a reset pad RES, a program voltage supply pad Vpp or a performance inspection pad may be formed on the pellet 2 in addition to the pads which have been described in the embodiment.

Although the invention accomplished by the present inventor has been described above by way of one embodiment in which it is applied to a so-called IC card which belongs to the applicable field thereof, the present invention is not necessarily limitative thereto and may also be applied to semiconductor devices having other types of package structure, such as a resin-sealed semiconductor device or a hermetically sealed semiconductor device, and a process for producing such a semiconductor device.

Advantageous effects obtained by a representative one of the novel techniques disclosed in this application will briefly be explained below.

There is provided a semiconductor device having a structure in which the principal surface of a semiconductor pellet is provided with a plurality of first bonding pad electrodes arranged in a first arrangement state and a plurality of second bonding pad electrodes which are provided with substantially the same electric circuit function as those of the corresponding first bonding pad electrodes and which are arranged in a second arrangement state that is different from the first arrangement state, thereby allowing selection of bonding pads which are to be connected to external terminals, respectively. Accordingly, it is unnecessary to prepare different kinds of pellets having individual bonding pad arrangements which respectively conform with various mounting methods as in the case of the conventional practice, and it is possible to cope with a multiplicity of different kinds of mounting methods with a single kind of pellet.

Embodiment 2

Figure 9:
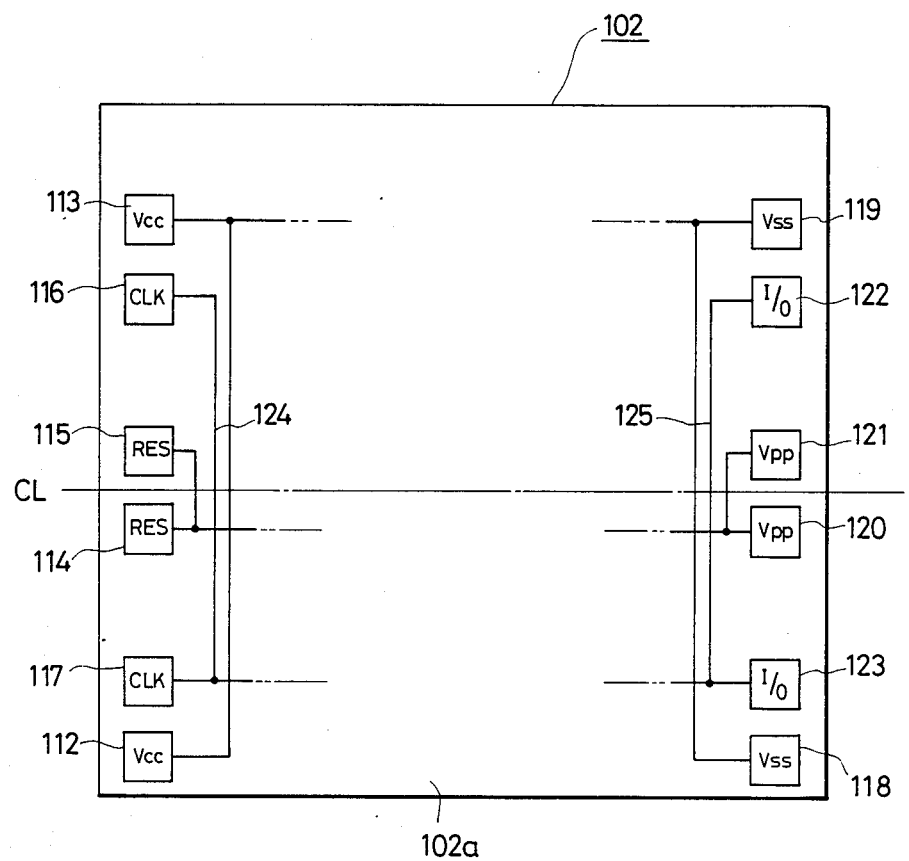
FIG. 9 is a plan view of an IC pellet mounted on the module (wiring substrate) illustrated in FIG. 8.

The semiconductor device according to this embodiment constitutes a so-called IC card 101 and has a rectangular planar shape with its four corners cut so as to be rounded as shown in FIG. 7. A semiconductor pellet 102 shown in FIG. 9 is mounted on a module 103 such as that shown in FIG. 8 which is obtained from a carrier tape, and incorporated in the IC card 101 in this state. External electrodes 104 which are electrically connected to the pellet 102 are exposed and slightly projected from the surface of the IC card 101.

The cross-sectional structure of the IC card 101 is substantially the same as that of the IC card of the embodiment 1 which is shown in FIG. 5. More specifically, the module 103 provided with the pellet 102 is mounted on a card substrate made of a rigid polyvinyl chloride, and oversheet films of a rigid polyvinyl chloride are respectively laminated on both the obverse and reverse surfaces of the card substrate. It should be noted that a magnetic stripe 107 is buried immediately above the pellet 102 by means of laminating, although this is not particularly limitative.

Figure 10:
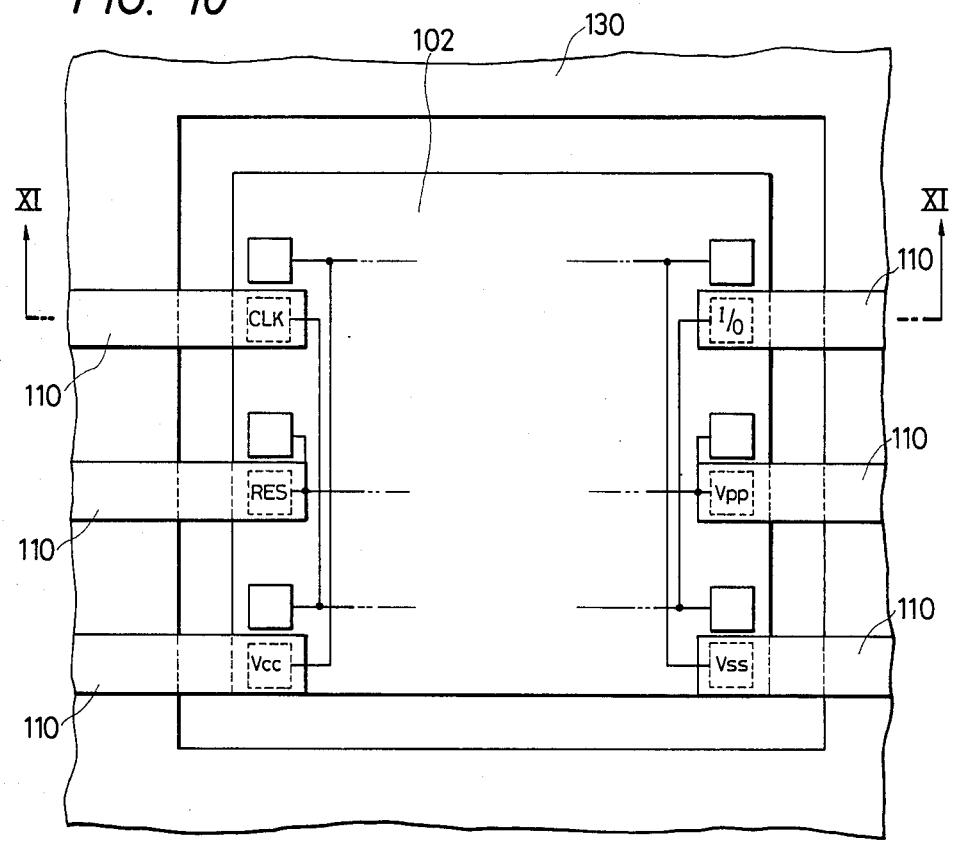
FIG. 10 is an enlarged plan view of the IC pellet and its periphery on the module illustrated in FIG. 8.
Figure 11:
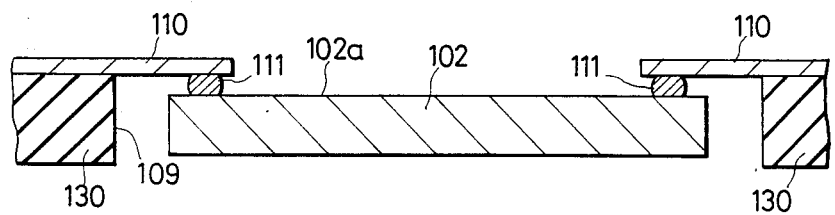
FIG. 11 is a sectional view taken along the line XI—XI of FIG. 10.

The module 103 is arranged as shown in FIGS. 8, 10 and 11. More specifically, printed wirings made of, for example, copper foil, or metallized layers 108 are bonded to the surface of an insulating sheet 130 made of, for example, glass epoxy resin, and external electrodes 104 are provided at respective outer ends of the metallized layers 108. The insulating sheet 130 is provided with a pellet mounting lore 109, and the other ends of the metallized layers 108 are integrally connected to predetermined finger leads 110, respectively, which are provided so as to extend to the upper side of the pellet mounting bore 109. Although not shown, the pellet 102 and its periphery are sealed with a resin for the purpose of protecting the surface.

The pellet 102 is, as shown in FIGS. 8 to 11, mounted according to the so-called face-down method wherein its surface 102a on which is formed a semiconductor integrated circuit faces the finger leads 110 of the module 103. More specifically, the pellet 102 is provided on its surface with bump electrodes 111 serving as bonding pad electrodes made of gold or solder, the bump electrodes being connected to the respective leads 110 using a bonding technique. The surface of the pellet 102 is covered with an undercoating material or a surface protecting material defined by, for example, an epoxy resin which is coated after the bonding of the leads 110. The surface protecting material is not shown for the purpose of simplifying the illustration.

The pellet 102 in accordance with this embodiment has a variety of bonding pad electrodes 112 to 123 arranged on its surface, that is, the semiconductor integrated circuit forming surface 102a, as shown in FIG. 9. In this embodiment, these bonding pad electrodes are arranged in a predetermined regular pattern such as a substantially mirror-symmetric pattern. More specifically, the bonding pad electrodes are disposed in such a manner that a plurality of required pads of the same kind are connected together so that, when the pellet 102 is turned upside down by rotating the surface 102a of the pellet 2 through 180 degree about the central line CL thereof, the pads are disposed near positions corresponding to predetermined pad positions before the turning of the pellet 02 and the module 103 therefore faces pads having the same functions as the pads which the module 103 faced before the turning of the pellet 102 at any positions thereon. Thus, the pads are arranged so that the external terminals of the module 103 are respectively connected to pads respectively having the same functions regardless of whether the pellet 102 is mounted in the face-up or face-down manner.

The pellet 102 in accordance with this embodiment has six pairs of bonding pads as shown in FIG. 9, i.e., a total of twelve bonding pad electrodes 112 to 123 are formed on the principal surface 102a of the pellet 102. Power supply (Vcc) pads 112, 113, reset (RES) pads 114, 115 and clock (CLK) pads 116, 117 are disposed on the left-hand side of the pellet 102, while ground (Vss) pads 118, 119, program voltage supply (Vpp) pads 120, 121 and input/output (I/O) pads 122, 123 are disposed on the right-hand side of the pellet 102. The pads 112, 114, 116, 118, 120 and 122 for the face-down bonding method and the pad electrodes 113, 115, 117, 119, 121 and 123 for the face-up bonding method which respectively correspond to the former electrodes are electrically connected together. In this embodiment, the two clock (CLK) pads 116 and 117 are electrically connected directly through ar electric wiring 124, and protecting circuits such as those described in the embodiment 1 are connected in series to the electric wiring 124. It should be noted that the protecting circuits may also be connected in series to the respective clock (CLK) pads 116 and 117 as described in the embodiment 1.

The two input/output (I/O) pads 122 and 123 are electrically connected directly through an electric wiring 125, and output buffer and surge absorbing circuits such as those described in the embodiment 1 are connected in series to the electric wiring( 125. Similarly, the output buffer and surge absorbing circuits may also be connected in series to the respective input/output (I/O) pads 122 and 123 as described in the embodiment 1.

As shown in FIG. 8, the IC card 103 is provided with external electrodes 104 which respectively correspond to the bonding pad electrodes formed on the pellet 102. Among the external electrodes on the IC card 103, those which are denoted by NC (None Connection) are external electrodes which are not connected to any bonding pad electrodes and provided as auxiliary electrodes for future development of the IC card function. The external electrodes NC are not connected to any electric circuit in the existing IC cards.

Figure 12:
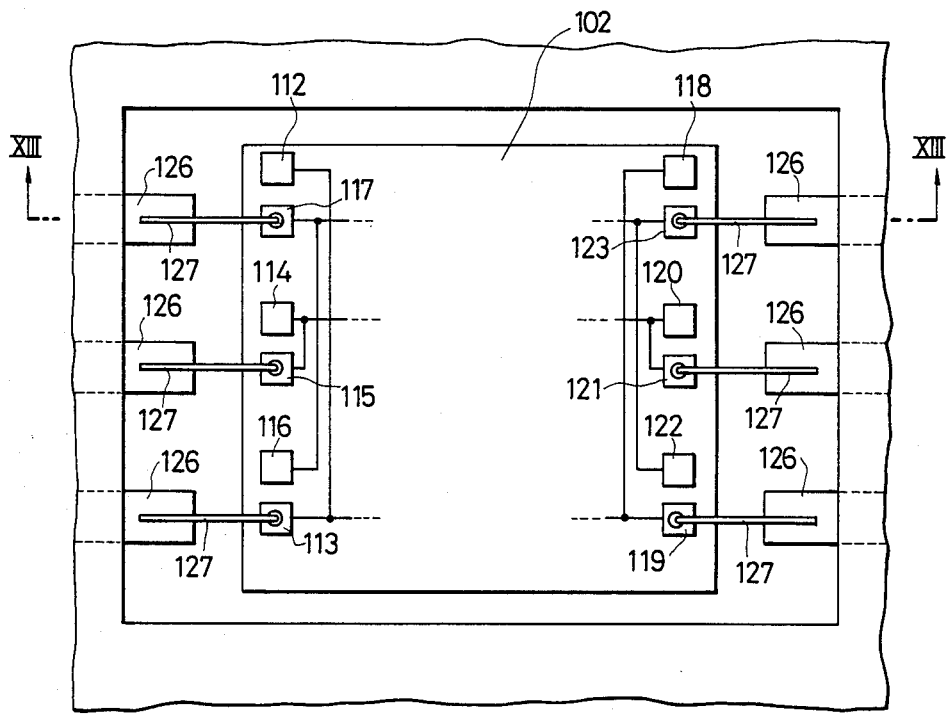
FIG. 12 is a fragmentary enlarged rear view of an IC module adopting the wire bonding type electric connection.
Figure 13:
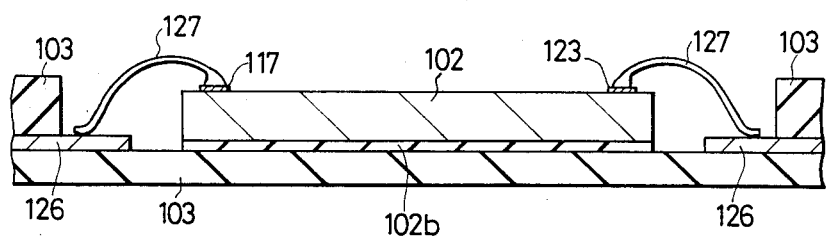
FIG. 13 is a sectional view taken along the line XIII—XIII of FIG. 12.

The pellet 102 may also be mounted on the module 103 using a bonding material 102b such as silver paste in a state wherein the opposite surface with respect to the integrated circuit forming surface 102a faces the surface the module 103, that is, according to the face-up mounting method, as shown in FIGS. 12 and 13. In such mounting method, the bonding pad electrodes of the pellet 102 are electrically connected to respective terminal leads 126 of the module 103 by, for example, wire bonding, as follows.

When the pellet 102 which is in the face-down state shown in FIGS. 10 and 11 is turned through 180 degrees so that the semiconductor integrated circuit forming surface 102a faces up, the pads which are bonded to respective leads 110 arranged in a predetermined pattern when the pellet 102 is mounted in the face-down mounting manner cannot match the electrode terminal arrangement on the module 103. Accordingly, there is a fear of pellets for face-down mounting being impossible to use for face-up mounting.

In this embodiment, however, pads for wire bonding are formed on the pellet 102 so that, when the pellet 102 is turned upside down by rotating the surface 102a of the pellet 102 through 180 degree about the central line CL shown in FIG. 9, the pads are disposed near positions corresponding to predetermined pad positions before the turning of the pellet 102 and the module 103 therefore faces pads having the same functions as the pads which the module 103 faced before the turning of the pellet 102 at any positions thereon. Accordingly, the pads and the corresponding terminal leads 126 can be electrically connected together by means of wire bonding using bonding wires 127 of gold or the like without the need to change the arrangement of terminals formed on the module 103 serving as a wiring substrate, or the arrangement of pads formed on the pellet 102.

More specifically, to mount the pellet 102 in the face-up manner as shown in FIGS. 12 and 13, it is only necessary to interconnect terminal leads 126 and the corresponding power supply (Vcc) pad 113, reset (RES) pad 115, clock (CLK) pad 117, ground (Vss) pad 119, program voltage supply (Vpp) pad 121 and input/output (I/O) pad 123 by means of respective bonding wires 127. Thus, it is possible to realize face-up or face-down mounting with a single kind of pellet without the need to change the arrangement of terminal leads 126 formed on the module 103 serving as a mounting substrate, simply by selecting pads to which corresponding terminal leads 126 or wires 127 are to be connected according to a particular mounting method employed.

As has been described above, it is possible, according to this embodiment, to obtain the following advantageous effects.

(1) Bonding pad electrodes are formed so that, when the pellet 102 is turned upside down by rotating the surface 102a of the pellet 102 through 180 degree about the central line CL shown in FIG. 9, the pads are respectively disposed near positions corresponding to predetermined pad positions before the turning of the pellet 102 and the module 103 therefore faces pads having the same functions as the pads which the module 103 faced before the turning of the pellet 102 at any position thereon, whereby external terminals can be respectively connected to pads respectively having the same functions regardless of whether the pellet 02 is mounted in the face-up or face-down manner. Accordingly, it is possible to realize either face-down or face-up mounting with a single kind of pellet 02 without the need to change the arrangement of terminals formed on the module 103 or the arrangement of pads on the pellet 102.

(2) By virtue of the advantage (1), it is possible, with a single kind of pellet 102, to increase the degree of freedom with which packaging is effected, and this enables diversification of the package structure.

Figure 14:
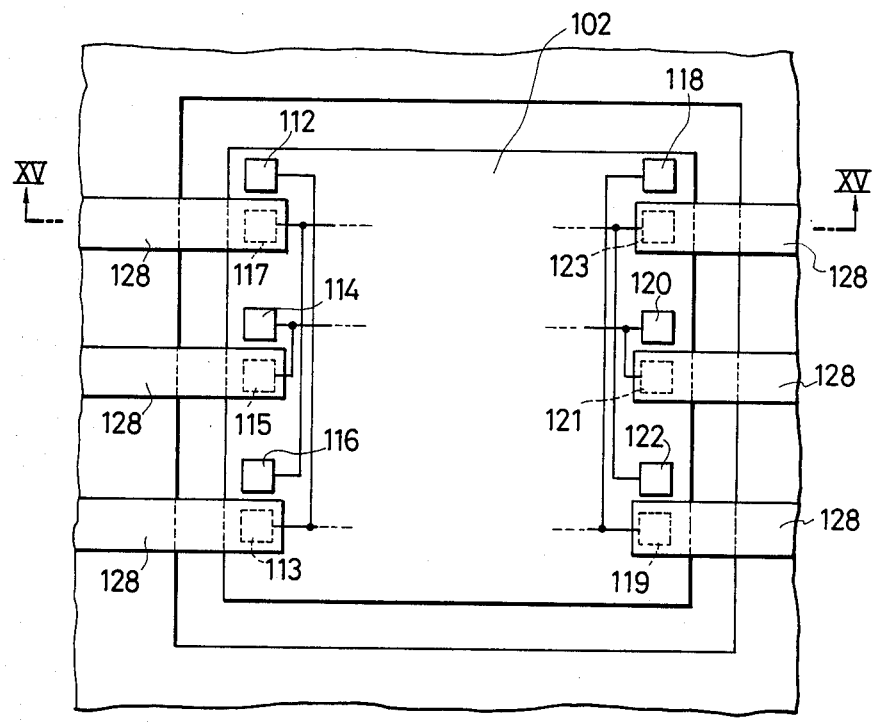
FIG. 14 is a fragmentary enlarged rear view of an IC module adopting the wireless bonding type electric connection.
Figure 15:
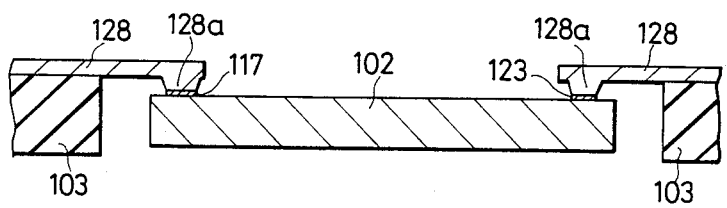
FIG. 15 is a sectional view taken along the line XV—XV of FIG. 14.

FIGS. 14 and 15 show in combination an arrangement in which finger leads 128 have respective bumps 128a formed thereon in advance and are bonded to corresponding bonding pad electrodes 113, 115, 117, 119, 121 and 123 by means of wireless bonding. This arrangement is advantageous in terms of costs over the arrangement in which bumps are respectively formed on bonding pad electrodes on the IC pellet 102 in advance. The bumps 128a can be formed on the respective distal end portions of the finger leads 128 by shaping the finger leads 128 by means of selective etching so that projections are formed at the distal end portions of the finger leads 128.

As will be clear from the above description, there is provided a semiconductor device having a structure in which one surface of an IC pellet is provided with a plurality of first bonding pad electrodes 112, 114, 116, 118, 120 and 122 arranged in a first arrangement state and a plurality of second bonding pad electrodes 113, 115, 117, 119, 121 and 123 which are provided with the same kinds of function as those of the corresponding first bonding pad electrodes and which are arranged in a second arrangement state, whereby it is possible to select bonding pads which are to be electrically connected to external terminal leads, respectively. Accordingly, one kind of semiconductor pellet and external terminal leads can be electrically connected together using many of the various methods such as the face-down and face-up mounting methods or wire bonding and wireless bonding methods. Thus, it is unnecessary, according to the present invention, to prepare different kinds of semiconductor pellets having individual pad arrangements which respectively conform with various mounting methods, and it is possible to cope with a multiplicity of different kinds of mounting methods with a single kind of semiconductor pellet.

What is claimed is:

1. A semiconductor device comprising a semiconductor pellet which is provided on its principal surface with a plurality of first bonding pad electrodes electrically connected by wiring extending on the semi-conductor pellet with respective ones of a plurality of semiconductor device electric circuit functions and arranged in a first arrangement, and a plurality of second bonding pad electrodes which are electrically connected by wiring extending on the semiconductor pellet with respective ones of the same plurality of electric circuit functions as those of the corresponding first bonding pad electrodes and which are arranged in a second arrangement which is different from said first arrangement such that the first and second bonding pad electrodes electrically connected with the same electric circuit functions are located on opposite sides and substantially the same distance from an imaginary straight line traversing said principal surface of said semiconductor pellet as seen in plan view, said first bonding pad electrodes being interconnected to respective external terminal leads of said semiconductor device by means of wire bonding.

2. A semiconductor device comprising a semiconductor pellet which is provided on its principal surface with a plurality of first bonding pad electrodes electrically connected by wiring extending on the semiconductor pellet with respective ones of a plurality of semiconductor device electric circuit functions and arranged in a first arrangement, each first bonding pad electrode having a bump electrode structure for wireless bonding, and a plurality of second bonding pad electrodes which are electrically connected by wiring extending on the semiconductor pellet with respective ones of the same plurality of electric circuit functions as those of the corresponding first bonding pad electrodes and which are arranged in a second arrangement which is different from said first arrangement such that the first and second bonding pad electrodes electrically connected with the same electric circuit function are located on opposite sides and substantially the same distance from an imaginary straight line traversing said principal surface of said semiconductor pellet as seen in plan view, said first bonding pad electrodes being interconnected to respective external terminal leads of said semiconductor device by means of wireless bonding.

3. A semiconductor device comprising a semiconductor pellet which is provided on its principal surface with a plurality of first bonding pad electrodes electrically connected by wiring extending on the semiconductor pellet with respective ones of a plurality of semiconductor device electric circuit functions and arranged in a first arrangement, and a plurality of second bonding pad electrodes which are electrically connected by wiring extending on the semiconductor pellet with respective ones of the same plurality of electric circuit functions as those of the corresponding first bonding pad electrodes and which are arranged in a second arrangement which is different from said first arrangement such that the first and second bonding pad electrodes electrically connected with the same electric circuit function are located on opposite sides and substantially the same distance from an imaginary straight line traversing said principal surface of said semiconductor pellet as seen in plan view, said first bonding pad electrodes being interconnected to respective external terminal leads of said semiconductor device by means of bonding wire.

4. A semiconductor device comprising a semiconductor pellet which is provided on its principal surface with a plurality of first bonding pad electrodes electrically connected by wiring extending on the semiconductor pellet with respective ones of a plurality of semiconductor device electric circuit functions and arranged in a first arrangement, and a plurality of second bonding pad electrodes which are electrically connected by wiring extending on the semiconductor pellet with respective ones of the same plurality of electric circuit functions as those of the corresponding first bonding pad electrodes and which are arranged in a second arrangement which is different from said first arrangement such that the first and second bonding pad electrodes electrically connected with the same electric circuit function are located on opposite sides and substantially the same distance from an imaginary straight line traversing said principal surface of said semiconductor pellet as seen in plan view.

5. A semiconductor device according to claim 4, wherein the arrangement of said second bonding pad electrodes is in substantially mirror-symmetric relation to the arrangement of said first bonding pad electrodes.

6. In a semiconductor device wherein a semiconductor pellet having an integrated circuit formed thereon is mounted on a substrate for an IC card, the improvement which comprises bonding pad electrodes provided on the surface of said semiconductor pellet, said electrodes being defined by a plurality of first bonding pad electrodes electrically connected by wiring extending on the semiconductor pellet with respective ones of a plurality of semiconductor device electric circuit functions and arranged in a first arrangement, and a plurality of second bonding pad electrodes which are electrically connected by wiring extending on the semiconductor pellet with respective ones of the same plurality of electric circuit functions as those of the corresponding first bonding pad electrodes and which are arranged in a second arrangement which is different from said first arrangement such that first and second bonding pad electrodes electrically connected with the same electric circuit function are located on opposite sides and substantially the same distance from an imaginary straight line traversing said principal surface of said semiconductor pellet as seen in plan view, wherein either a plurality of said first or second bonding pad electrodes are electrically connected to respective external terminal leads of said semiconductor device.

* * * * *